United States Patent [19]

Hanson et al.

[11] 3,872,491

[45] Mar. 18, 1975

[54] ASYMMETRICAL DUAL-GATE FET

[75] Inventors: John W. Hanson, Salt Lake City, Utah; John D. MacDougall, Williamstown, Mass.

[73] Assignee: Sprague Electric Company, North Adams, Mass.

[22] Filed: Mar. 8, 1973

[21] Appl. No.: 339,270

[52] U.S. Cl. .................... 357/23, 148/1.5, 329/101, 330/35, 357/41, 357/74, 357/91

[51] Int. Cl. .......................... H01l 5/06, H01l 19/00

[58] Field of Search ....... 330/35; 317/235 B, 235 G, 317/235 AY; 357/91, 23, 41

[56] References Cited

UNITED STATES PATENTS

| | | | |
|---|---|---|---|
| 3,417,464 | 12/1968 | Fang et al. | 317/235 G |
| 3,480,873 | 11/1969 | Carter | 330/35 X |
| 3,653,978 | 4/1972 | Robinson | 317/235 G |
| 3,775,191 | 11/1973 | McQuhae | 317/235 G |

*Primary Examiner*—Michael J. Lynch
*Assistant Examiner*—William D. Larkins
*Attorney, Agent, or Firm*—Connolly and Hutz

[57] ABSTRACT

A dual gate FET is described wherein the second channel is made more conductive than the first such that when employed as an amplifier or a mixer circuit, zero bias is required from the gates to ground.

1 Claim, 12 Drawing Figures

ASYMMETRICAL DUAL-GATE FET

BACKGROUND OF THE INVENTION

This invention relates to dual gate field effect transistors (FET's), and amplifier circuits wherein dual gate FET's are employed as the active devices.

One normal dual gate MOSFET construction comprises a base material of N type silicon crystal about 0.01 inch thick; having three separate P+ regions diffused therein adjacent to one surface, the three regions usually lying in a straight line; the region lying between the first P+ region and the second P+ region being defined as a first conductive channel while the region lying between the second P+ region and the third P+ region being defined as a second conductive channel, having a silicon oxide film covering at least two channel regions, and having two thin metal electrodes on the silicon oxide film each covering that area just over one of the two channel regions. Connections are made to the first P+ region, called the source; the first channel electrode, called the first gate, the second channel electrode, called the second gate, and the third P+ region called the drain. The second P+ region called the virtual source-drain has no lead wire attached.

The typical dual gate structure just described is suitable for operation in the enhancement mode. With a negative voltage applied to the drain relative to the source, a negative voltage must be applied to both gates before current can flow between the source and drain.

When the structure of the above device is modified such that the two channel regions are doped with P type impurities then the device may become suitable for operation in the depletion mode. In this case, with a negative voltage applied to the drain relative to the source and zero voltage applied to the gates, current flows between source and drain. A positive voltage applied to the gates causes the source to drain current to diminish.

If in the above structural examples, the type of dopant in all the regions of the silicon material are reversed, two additional practical devices are created having similar operating characteristics except with voltages and currents reversed. The above described devices have symmetrically doped channels representing predominant practice in the industry.

The possibility has been recorded for constructing a dual gate FET wherein the first channel is doped with impurities of opposite type to the body and the second channel is not doped at all. However, to our knowledge no practical application of this one or any other asymmetrically doped structure has been proposed.

This invention is concerned with particular asymmetrical dual gate FET structures having special advantages for use in amplifier and mixer circuits. The structure just mentioned above does not offer such advantages.

Consider now an amplifier circuit employing a conventional symmetrical dual gate FET as its active element. The signal gain of the circuit is directly proportional to the transconductance of the transistor, hereinafter referred to as the first transconductance. The first transconductance is defined as the ratio of signal drain current to signal voltage at the first gate, for the conditions that a d.c. voltage is applied between source and drain, and the voltage at the second gate is also held fixed relative to the source. For the conventional dual gate FET, the first transconductance is normally optimized by application in an amplifier circuit, of appropriate circuit bias voltages to each of the two gates, since for zero bias on both gates the first transconductance is quite low, and in fact too low for most practical purposes.

The second transconductance is defined as the ratio of signal drain current to signal voltage at the second gate, for the conditions that a d.c. voltage is applied between source and drain, and the voltage at the first gate is also held fixed relative to the source.

The conventional dual gate FET has been found especially useful as a signal mixer or signal converter. The two signals to be mixed, normally a local oscillator (LO) signal and a radio frequency (RF) signal, are usually each applied to one of the two gates. The conventional figures of merit for mixer circuits is the conversion transconductance ($g_{mc}$), which is defined as the magnitude of the drain current signal whose frequency is the difference of the frequencies of the two signals being mixed, to the magnitude of the input RF signal voltage at the gate. The conversion transconductance ($g_{mc}$) can be shown to be proportional to the sum of the slopes of the two curves, of first transconductance versus second gate voltage and second transconductance versus first gate voltage. The bias voltages are normally adjusted so that the sum of the slopes of the above mentioned characteristic curves of the dual gate FET is as large as possible for an optimum conversion transconductance.

The conventional dual gate FET has also been used as a mixer wherein both signals to be mixed are applied to the first gate. For an optimum conversion transconductance in this case, the bias voltage on each gate may be adjusted such that the transistor operating point lies in the area of maximum slope in a first transconductance curve versus voltage on the first gate.

For the three applications of a conventional symmetrical dual gate FET noted, some practitioners employ a source to circuit-ground resistor for self bias and stabilization of circuit operation with temperature. The total bias relative to the source on each gate is thus the difference of the applied gate to ground bias voltage and the self bias voltage developed with respect to ground due to the steady state current through the resistor. On the other hand, some practitioners short the source to ground. In all cases however, a non-zero bias voltage must be applied to at least one gate and usually to both. Bias provisions represent a significant portion of overall circuit costs.

It is therefore an object of this invention to provide an asymmetrically doped dual gate FET that is suitable for operation with zero bias applied to both gates relative to circuit ground, whether or not a self biasing resistor is used, for use as an amplifier or a mixer.

SUMMARY OF THE INVENTION

It is shown that in a dual gate FET, the second channel region may contain either a greater concentration of opposite type conductivity impurities relative to the body type, or a smaller concentration of the same type conductivity impurities relative to the body type, or both, causing the second channel region to be more conductive than the first channel region. Dual gate FET's, representing special cases of such asymmetrical doping in the two channel regions, are disclosed whereby the transistor characteristics are optimized for use in amplifer or mixer cicuits wherein the same bias voltage is applied to both gates relative to the source, as for a circuit providing a self bias resistor and zero bias applied between each gate and circuit ground. Amplifier and mixer circuits are disclosed, employing such asymmetrically doped transistors, some with and some without provisions for self bias, having zero bias provided from circuit ground to the two gates. Also a three leaded package is disclosed for housing certain asymmetrical transistors of this invention.

DESCRIPTION OF THE PREFERRED EMBODIMENT

Figure 1:
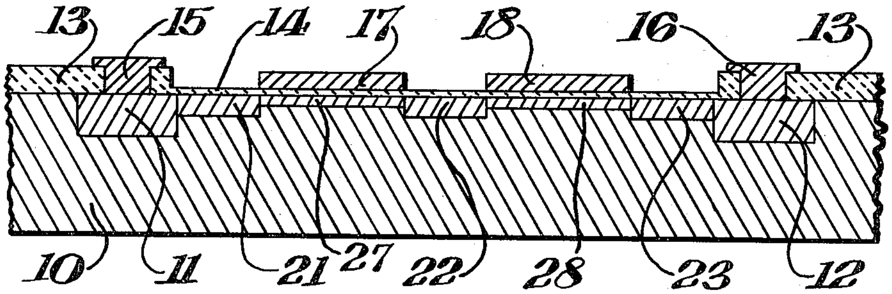
FIG. 1 shows in cross section a dual gate FET representing embodiments of this invention.

In FIG. 1 there are revealed in cross section, not necessarily to scale, the major structural features of a typical dual gate field effect transistor representing a first preferred embodiment of this invention. The silicon crystal body 10, being of N type conductivity, has formed within it and adjacent to one of its surfaces a source region 11 and drain region 12 both of P+ conductivity. The + sign indicates heavy doping and thus a high conductivity region. A thick silicon oxide layer 13 covers the one surface except near the center of the source region 11, drain region 12, and the area lying between source and drain regions. A thin silicon oxide layer 14 covers the one surface between the source region 11 and the drain region 12. Metal contacts 15 and 16 make ohmic connection to the source region 11 and drain region 12, respectively. A metal electrode 17 lies in contact with the thin insulating layer 14 and being closer to the source region 11, is designated the first gate electrode. A metal electrode 18 lies in contact with the film 14 and being closer to the drain region 12 is designated the second gate electrode. The contacts 15 and 16, and electrodes 17 and 18 consist of aluminum having been simultaneously formed by a process of vacuum deposition.

Lying directly beneath each gate electrode, but within the silicon body 10 and adjacent to its surface, are channel regions of P type conductivity. The first channel region 27 lies registered beneath the first gate electrode 17, and the second channel region 28 lies registered beneath the second gate electrode 18.

The three regions, 21, 22 and 23, are of P+ conductivity having been formed by a process of ion implantation through the thin oxide layer 14. The region 21 effectively extends the source region 11 to the first channel 27. Similarly, the region 23 effectively extends the drain region 12 to the second channel 28. The region 22 connects the two channels and is designated the virtual-source-drain. Lead wires (not shown) are attached to the source contact 15, the first gate electrode 17, the second gate electrode 18, and the drain contact 16. Another ohmic type contact (not shown) is made to the silicon body 10 at the other surface, or bottom surface as shown in FIG. 1, and is normally electrically connected by a wire to the source contact 15.

Figures 3, 4, 5, 6, 7:
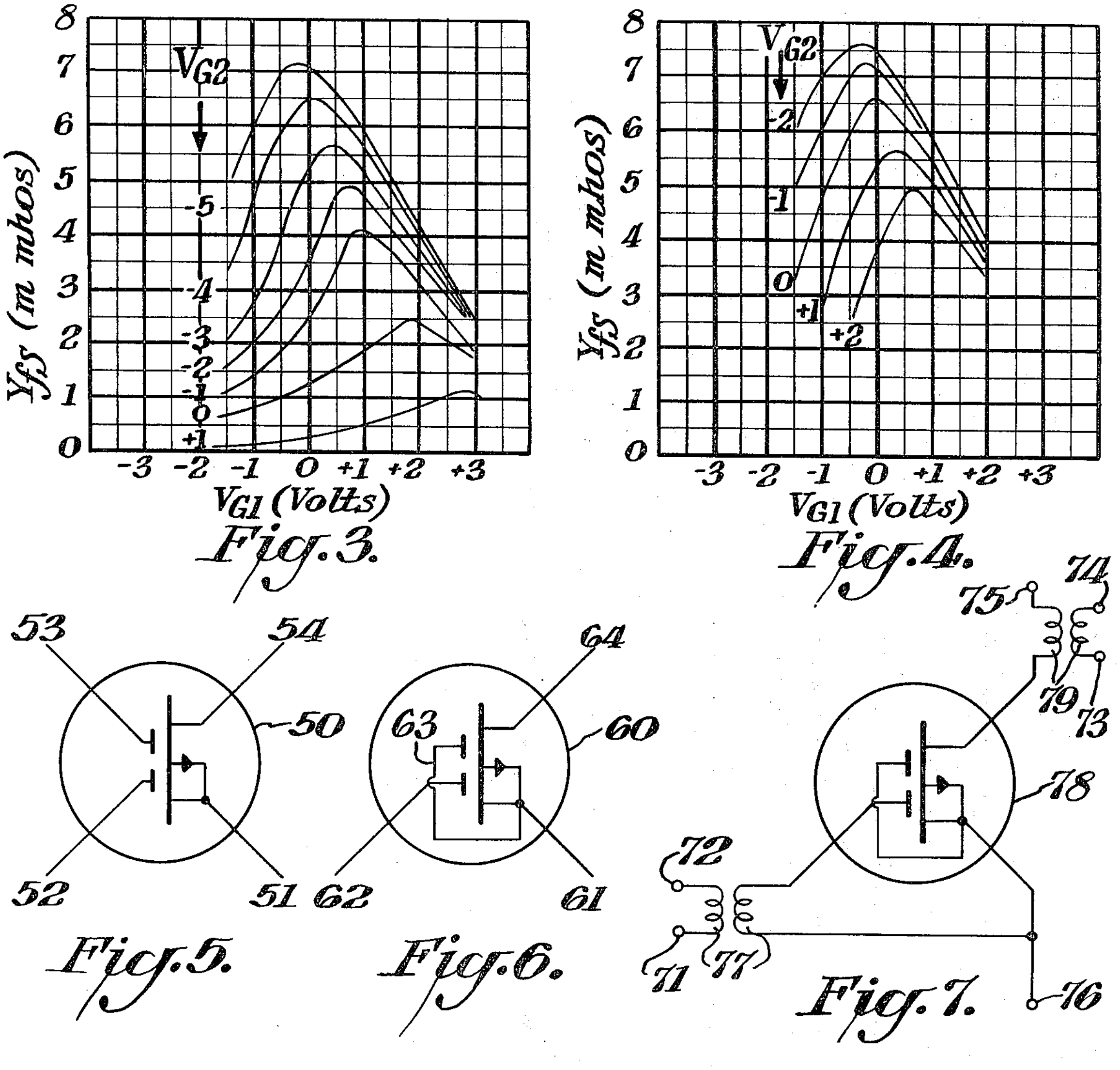
FIG. 3 is shown a family of curves representing a conventional symmetrical dual gate FET.
In FIG. 4 is shown a family of curves representing a dual gate FET of this invention.
FIG. 5 shows a conventional symbol for a packaged dual gate FET, having four leads.
FIG. 6 shows a symbol representing a packaged dual gate FET of this invention, having three leads.
FIG. 7 shows an amplifier circuit embodiment with no self bias, employing a transistor of this invention.

In this first preferred embodiment, both channel regions are doped with P type impurities and the second channel region contains a higher impurity concentration than the first channel. The performance advantages of the asymmetrical dual gate FET of this invention, compared to a symmetrically doped but otherwise similar transistor, are partially revealed in FIGS. 3 and 4. There is shown in FIG. 3 a family of first transconductance curves, for a typical symmetrical P channel dual gate FET, plotted as a function of the bias voltage ($V_{G1}$) on the first gate with −12 volts applied to the drain relative to the source. Each curve in the family is associated with a particular bias voltage on the second gate. The language, "bias on the - - - gate", will be used herein to mean bias on a gate relative to the source unless otherwise specified. It can be seen that the first transconductance ($Y_{fs}$) for the conditions of zero bias on both gates is very low and that to achieve a high and useful transconductance, a bias is required on the second gate ($V_{G2}$). In FIG. 4 is shown a family of first transconductance curves, for −12 volts at the drain, for a P channel dual gate FET having a second channel region with heavier impurity concentration than the first channel region.

For the conditions of zero bias on both gates, the first transconductance of this transistor is much higher than the corresponding first transconductance for a symmetrically doped FET represented by FIG. 3, and is well within the useful range for most amplifier circuit applications. In fact, the curves of FIG. 4 represent a transistor wherein the impurity concentrations of the two channels have been adjusted so as to achieve an optimum first transconductance for zero bias on both gates, namely optimum in the sense that the maximum point of the curve associated with zero bias on the second gate occurs for the condition that the voltage on the first gate is zero. This transistor is thus especially suitable for use in an amplifier circuit wherein zero bias is provided to both gates.

A second preferred embodiment consists in a dual gate FET of the first preferred embodiment wherein the impurity types, but not the impurity concentrations, are reversed. This second preferred embodiment is also represented by the FIG. 1 and its description above except that body 10 becomes P type whereas regions 11, 21, 27, 22, 28, 23, and 12 become N type.

Figure 2:
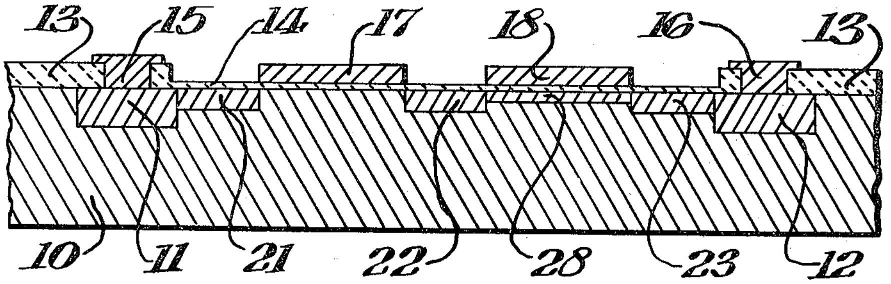
FIG. 2 shows in cross section a dual gate FET representing two additional embodiments of this invention.

In yet a third preferred embodiment, represented by FIG. 2, the body 10 is P type. The source and drain regions 11 plus 21, 22, and 23 plus 12 are N+ conductivity. The first channel regions consists of undoped body material and the second channel is doped with N type impurities. A subtle feature of this embodiment is the conduction of the undoped first channel region, for the condition of zero bias voltage applied to the first gate. The oxide-semiconductor interface charge, usually denoted by Qss, is normally positive thus inducing beneath, a thin channel that is effectively an N type conductivity channel. It will be noted that this third preferred embodiment is essentially the same as the second preferred embodiment except that here the first channel region is not doped. Both channel regions are suitable for operation in the depletion mode.

A fourth but nonpreferred embodiment may be one in which the body 10 is N type, while the regions 11 plus 21, 22, and 23 plus 12 are P+ conductivity types. The first channel is not doped and the second channel region is doped with P type impurities. Those skilled in the art will recognize that the first channel will not conduct current as readily as the equivalent first channel of the third preferred embodiment assuming zero volts bias is applied to the first gate of both. This result obtains as a consequence of the oxide-semiconductor surface interface charge, Qss, that normally aids channel conduction in the third preferred embodiment but normally impedes channel conduction in this fourth embodiment. It is necessary to employ unconventional methods for producing the oxide layer in this embodiment such that the surface charge is negative. Known methods for accomplishing this, such as diffusing gold into the oxide layer, normally degrade the transconductance and other performance features of an FET.

A fifth embodiment employs a body of P type conductivity. The second channel region is undoped and the first channel region is doped with P type impurities. The structure of this embodiment is represented in FIG. 2 where unlike for the third embodiment, region 12 and 23 are designated the source, region 28 is designated the first channel region, and region 21 and 11 the drain. The electrodes 18 and 17 are associated with the first and second gates respectively. This embodiment is only workable for most purposes when its structure is so designed that Qss is positive and unusually large. This may be achieved by using a body whose surface is parallel to the 111 crystal plane and using appropriate gate oxide conditions. Both channels are then normally conducting with zero bias on both gates.

A sixth embodiment structurally represented by FIG. 1 employs a body 10 of P type conductivity. The first channel region 27 is doped with P type impurities while the second channel region 28 is doped with N type impurites. The surface of the body material is parallel to the 111 crystal plane as for the fifth embodiment, and for the same reasons.

In all of the above noted embodiments the second channel is more conductive than the first channel for the condition that the same bias voltage is applied to both gates. Also for all embodiments both channels are conductive for zero bias applied to both gates.

The conventional symbol for a dual gate FET having P type channels, which FET is encapsulated, housed, or otherwise packaged with lead wires or terminals giving electrical access to the source, the drain and the two gates, is shown in FIG. 5. Wire 51 connects the source, 52 the first gate, 53 the second gate and 54 the drain. The package is represented by the circle 50. The arrow is directed away from the body having the conventional meaning that the two channels are P type. The line on which the arrow is placed represents the internal wire normally connected between the body material and the source.

A dual gate FET constructed according to the principles of this invention may require no bias on either gate to achieve a high and useful gain. Therefore for many applications a permanent shorting wire may be connected internal to the package between the second gate and the source. In FIG. 6 is shown a symbol representing such a packaged transistor where wire 61 connects the source, wire 62 the first gate, wire 64 the drain and wire 63 connects the second gate to the source internal to the package 60. Also, previously noted, the body material is internally connected to the source.

A transistor of this invention may be employed in an amplifier circuit having no bias provided to either gate as shown in FIG. 7. The signal to be amplified is applied to terminals 71 and 72 and therefore impressed upon the primary winding of r.f. transformer 77. The voltage thus generated at the secondary winding of transformer 77 is impressed with zero bias between the first gate and the source of the dual gate FET 78. The second gate is connected directly to the source. Terminal 76 may be grounded. On lead of the primary of the r.f. transformer 79 is connected to terminal 75, the negative drain supply voltage terminal. The other primary lead is connected to the drain. The amplified signal appears across a load (not shown) that is connected to the secondary terminals 73 and 74 of the transformer 79. The load is reflected to the primary of transformer 79 so that in effect the d.c. supply voltage is connected in series with the load and the transistor from drain to source. The use of the asymmetrically doped dual gate FET of this invention obviates the need for bias circuits for the gates and achieves significant circuit simplification and reduced circuit costs. A procedure for determining the appropriate doping levels in the two channel regions is presented later herein.

Figure 8:
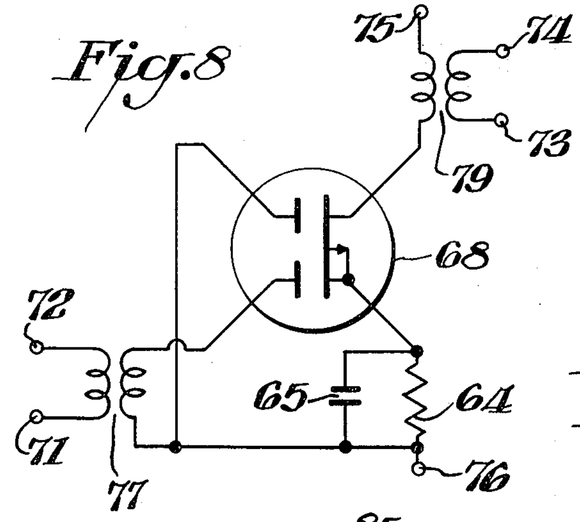
FIG. 8 shows an amplifier circuit embodiment with self bias, employing a transistor of this invention.

Further, the use of the three leaded package of FIG. 6 permits even further economies in the fabrication of circuits employing this transistor. Also the short direct internal connection of FIG. 6 minimizes the possibility of electromagnetic coupling to stray signals and minimizes the lead inductance from the second gate to the source or ground, thus further improving the already inherently good high frequency performance characteristics of dual field effect transistors. In FIG. 8 is shown an amplifier circuit embodiment that is essentially the same as the circuit of FIG. 7 except a self bias source resistor has been added in series with the external power supply at terminals 75 and 76, the transistor from source to drain and the reflected load at the primary of output transformer 79; a signal shunting capacitor 65 is optional and when used is connected in parallel with resistor 64; and transistor 68 has been modified compared to the transistor 78 of FIG. 7. If, for example, the transistors are made according to the first embodiment of this invention then the channel regions in transistor 68 are each more heavily doped than their counterparts in transistor 78. For example, if the drain current through resistor 64 causes a steady state voltage drop of one volt, both gates receive a one volt bias voltage. As will be seen more explicitly later, the two channel regions of transistor 68 should have about $2\times10^{11}$ ions/cm$^2$ more doping than the respective channels in transistor 78, (assuming an 800 A thick silicon oxide layer).

Figure 9:
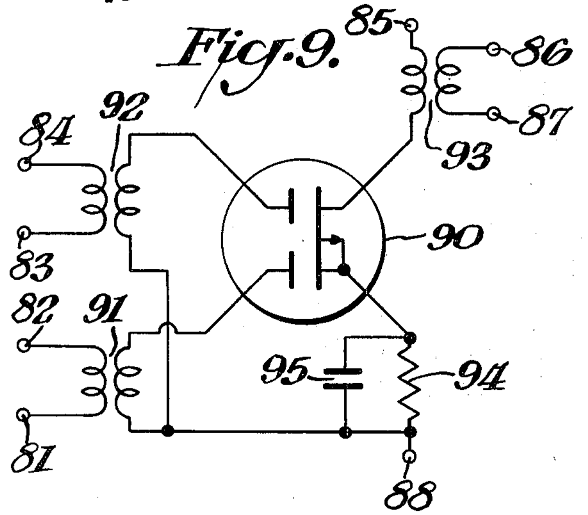
FIG. 9 shows a mixer circuit embodiment, employing a transistor of this invention.

With reference to FIG. 9, a P-channel asymmetrical dual gate FET 90 of this invention is employed in a preferred mixer circuit wherein the source is connected through a resistor 94 to circuit ground 88. The drain is connected through the primary of output transformer 93 to terminal 85 and a fixed d.c. voltage supply (not shown) is connected with negative potential at terminal 85 and positive potential at terminal 88. The RF signal to be mixed is applied to terminals 82 and 81, the primary of input transformer 91. The signal generated at the secondary of transformer 91 is then connected so as to be impressed between circuit ground 88 and the first gate. Similarly the local oscillator (LO) signal to be mixed is connected to terminals 83 and 84, the primary of transformer 92, and this signal is impressed between the circuit ground 88 and the second gate. Zero bias is thus provided to both gates relative to circuit ground. A signal bypass capacitor 95 is connected across resistor 94. Thus the RF and LO signals in this mixer circuit embodiment are effectively connected between the source, and the first and second gates respectively, of transistor 90. A further useful embodiment is obtained when the RF and LO signals are reversed such that the RF signal is connected to the second gate and the LO signal to the first gate. The signal bypass capacitor 95, in either case, is optional. Without it a negative signal feedback reduces the signal gain.

For the condition that the ohmic value of resistor 94 is zero, the mixer circuit will provide optimum conversion efficiency when in the dual gate FET, the impurity concentrations in the first and second channel regions have been so adjusted that the point of maximum slope in the characteristic curve of second transconductance for zero bias on the second gate, versus the voltage on the first gate occurs for the condition that the voltage on the first gate is zero; and the point of maximum slope in the characteristic curve of first transconductance, for zero voltage on the first gate, versus the voltage on the second gate occurs for the condition that the voltage on the second gate is zero.

Figure 10:
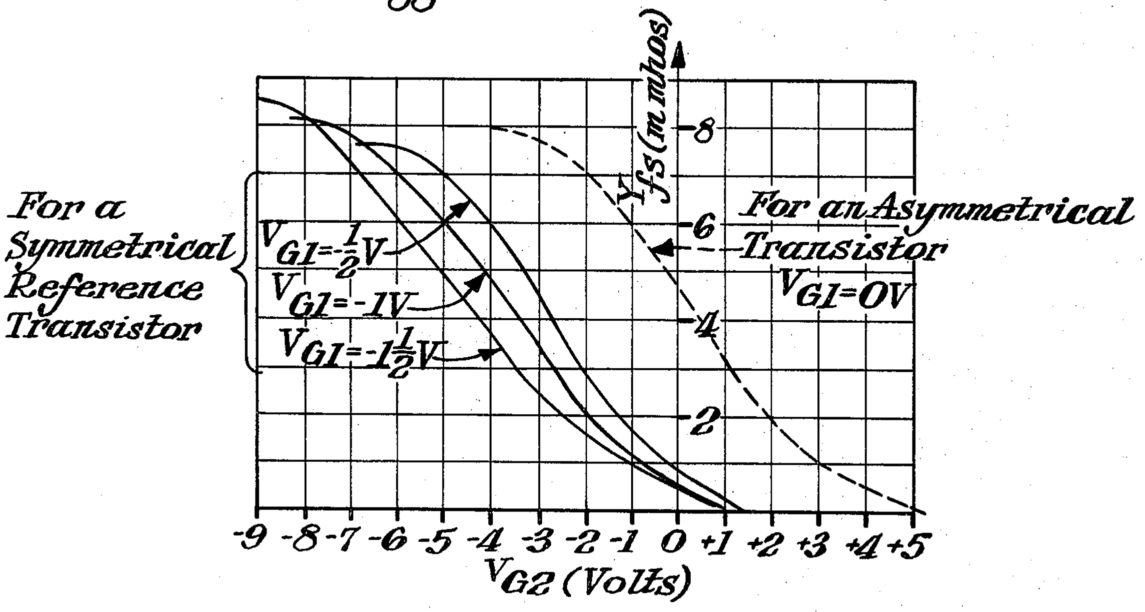
FIG. 10 shows a family of curves partially characterizing a dual gate FET.

The appropriate doping levels for the two channel regions, to meet the above stated criteria may be determined as follows:

A conventional symmetrical dual gate FET is chosen as a reference transistor. It is characterized by measuring the first and second transconductance for a wide range of bias conditions from gates to source. From such data a family of curves of first transconductance such as that depicted in FIG. 3 for a symmetric depletion mode p channel dual gate FET may be drawn. From this set of curves, or from the raw data, a new family of curves of first transconductance versus the voltage on the second gate may be constructed as shown in FIG. 10 (solid lines). A similar family (not shown) of second transconductance versus the voltage on the first gate is also constructed from the data. From these latter two families, a first and second candidate bias condition on the first and second gates, respectively, is chosen such that the point of maximum slope in the characteristic curve of second transconductance for the second candidate bias on the second gate versus the voltage on the first gate occurs for the condition that the voltage on the first gate is equal to the first candidate bias. Simultaneously the condition must be met that the point of maximum slope in the characteristic curve of first transconductance for the first candidate bias on the first gate, versus the voltage on the second gate occurs for the condition that the voltage on the second gate is equal to the second candidate bias. The final choice of optimum gate bias voltages is normally made quickly through the trial and error and convergence aided by graphical visualization.

In a mixer circuit employing the aforementioned reference transistor wherein the thus chosen biases are applied, an optimum conversion efficiency is realized. An asymmetrical dual gate FET is now constructed as described below. This asymmetrical transistor will operate with optimum conversion efficiency in the same circuit except with zero bias applied to the gates.

In FIG. 10 the solid curves represent the first transconductance of a reference transistor for which the chosen biases which yield optimum conversion efficiency are $V_{G1} = -1V$ and $V_{G2} = -4V$. Also shown in FIG. 10 are the first transconductance curves of a reference transistor for $V_{G1} = -½V$ and $V_{G1} = 1½$V. The dotted curve in FIG. 10 represents the asymmetrical transistor having been deduced from the reference transistor. The dotted curve is seen to be a replica of the solid curve for $V_{G1} = -1V$ for the symmetrical reference transistor. This solid curve has a maximum slope point at $V_{G2} = -4V$ whereas the dotted curve has a maximum slope point at $V_{G2} = 0V$. This difference relative to second gate bias is accomplished by an increased doping in the second channel of about $8\times10^{11}$ ions/cm$^2$. The difference relative to the first gate bias is accomplished by increasing the doping in the first channel by about $2\times10^{11}$ ions/cm$^2$.

Now considering the mixer circuit embodiment of FIG. 9 wherein resistor 94 is not zero, and which resistor causes a self bias voltage to appear between the source and each of the gates, it is clear that for any predicated steady state voltage drop across resistor 94, one can use exactly the same procedure as before for determining the amount of change in impurity concentrations required for the transistor to provide optimum conversion transconductance. A further increase of doping with P-type impurities in both channels will be necessary such that the gate bias voltage values on the curves of this P-channel transistor will differ from the previous asymmetrical FET (for resistor 94 being zero) by the amount of the predicated self bias. The new family of curves created will characterize the transistor wherein the impurity concentrations in the two channel regions have been changed as calculated to accommodate the self bias condition and zero bias between each gate and ground.

Figure 11:
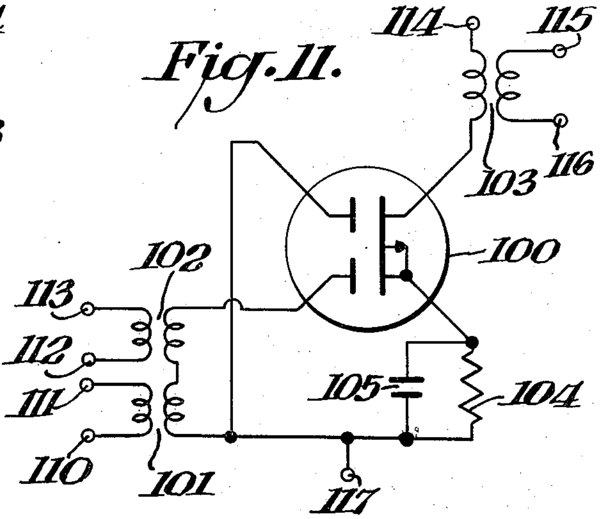
FIG. 11 shows another mixer circuit embodiment employing another transistor of this invention.

With reference to FIG. 11, a P-channel asymmetrical dual gate FET 100 of this invention may be enployed in a mixer circuit wherein the source is connected through a resistor 104 to circuit ground 117. The drain is connected through the primary of output transformer 103 to terminal 114 and a fixed d.c. voltage supply (not shown) is connected with negative potential at terminal 114 and positive potential at terminal 117. The R.F. signal to be mixed is applied to terminals 111 and 110, the primary of input transformer 101. The local oscillator signal to be mixed is connected to terminals 112 and 113, the primary of transformer 102. The secondaries of transformers 101 and 102 are connected in series and thence from circuit ground 117 to the first gate. A signal bypass capacitor 105 is connected across resistor 104. Thus the RF and LO signals are effectively connected between the first gate and the source of transistor 100.

For the condition that the ohmic value of resistor 104 is zero, the mixer circuit will provide optimum conversion efficiency when in transistor 100, the impurity concentrations in the first and second channel regions have been so adjusted that the region of maximum slope in the characteristic curve of first transconductance for zero bias on the second gate occurs for the condition that the voltage on the first gate is zero.

Again referring to FIG. 3 it will be seen that an adjustment of the impurity concentrations in the first and second channels of this symmetrical transistor is required so as to effectively bias it at about $V_{G1} = +3V$ and $V_{G2} = -5$ volts.

Using the same reasoning as for the transistor in the mixer circuit of FIG. 9, when the self biasing resistor 104 of FIG. 11 is not zero, and a predicated steady state bias voltage is given as a design factor, first attention is given to a family of transconductance curves, such as in FIG. 3, for a symmetrical reference transistor. Gate bias conditions are determined for which optimum conversion transconductance can be expected. The appropriate changes in dopant impurity concentrations in each channel are then determined using the equivalency factor between channel region impurity concentration and gate bias. The asymmetrical transistor is then made the same as the reference transistor except incorporating the changes in channel doping. This transistor will now operate in FIG. 11 with the value of the self biasing resistor 104 adjusted so that the voltage across it equals the predicated steady state bias voltage, and optimum conversion transconductance is realized with zero bias on both gates.

The determinations of the appropriate doping levels in the first and second channel regions of a dual gate FET of this invention for a given amplifier or mixer application must take into account such factors as conductivity of the starting body material, the crystal orientation of the major surfaces of the body, and the device geometry. Therefore a conventional symmetrical dual gate FET may be fabricated, with carefully controlled dopant impurity levels in the channel regions, and used as a reference. This reference transistor may be characterized by curves similar to those shown in FIG. 3. This reference transistor may be tested in a circuit wherein bias voltages are applied and adjusted for some optimum performance criteria such as conversion efficiency for a mixer circuit. From such empirical data, the necessary bias voltages at each gate relative to the source are determined for optimum performance.

It is known by those skilled in the art that there exists an equivalency between gate to source bias voltage and channel region impurity concentration over a wide range. For ion implantation of a shallow doped layer in a channel region through an 800 A thick silicon dioxide layer, doping with $2\times10^{11}$ ions/cm$^2$ is equivalent to about one volt of bias, gate to source. Increased doping with impurity atoms of opposite conductivity type, results in the affected channel becoming more conductive and thus is equivalent to an increment of gate bias voltage of + polarity for N channel devices and − polarity for P channel devices.

Thus with reference to the curves of FIG. 3, an additional boron doping in the second channel of about $8\times10^{11}$ ions/cm$^2$, changes the curves to those of FIG. 4. For zero bias on the second gate in FIG. 4, the curve of first transconductance versus voltage on the first gate is equivalent to the curve in FIG. 3 with −4 volts on the second gate. Similarly an increased boron doping of $2\times10^{11}$ ions/cm$^2$ in the first channel would have shifted the curves in FIG. 3 to the right by about 1 volt on the $V_{G1}$ scale.

Transistors of the first preferred embodiment were fabricated utilizing the processes and sequential steps briefly described as follows:

1. An N type silicon slice is used as the body material.
2. A silicon oxide layer of about 5000 A thickness is grown over the surface by thermal oxidation.
3. Two openings are formed in the oxide layer on one body surface by a normal photomasking and etching step.
4. Boron is diffused into the silicon through the two openings, forming the highly conductive (P+) source and drain regions.
5. An oxide layer is again grown over the surface by thermal oxidation which layer is about 5000 A thick.
6. A long narrow opening is formed in the oxide layer by a normal photomasking and etching step. This opening slightly overlaps the drain region and the source region and overlies the two channels yet to be formed.
7. An oxide layer about 800 A thick is grown over the exposed silicon surface.
8. A photo resist mask is superimposed with one opening over the half of the area exposed by the oxide opening of step 6, that is adjacent the drain region.
9. By the normal process of ion implantation boron ions passing through the opening in the photo-resist mask, are driven through the 800 A thick oxide layer and into the silicon body. A portion of this newest P type region will become the second channel. A dose of $8.0\times10^{11}$ ions/cm$^2$ was implanted at 42 Kev.
10. The photo resist is then entirely removed.
11. Boron is again implanted through the 800 A oxide layer into both channel regions at a dose of $10.0\times10^{11}$ ions/cm$^2$ at 42 Kev.
12. The silicon slice is heat treated at 950°C in a nitrogen ambient for approximately 10 minutes to anneal the implanted regions.
13. Two openings are formed in the oxide layer each covering a portion of the source and drain, respectively.
14. An aluminum layer is deposited over the surface.
15. By a normal photo-etch process aluminum is removed so as to leave two aluminum islands covering the two channel regions, and one gap between the islands, and one gap each between an island and the P+ region of the source and the P+ region of the drain, respectively.
16. By ion implantation of boron, the silicon regions directly beneath the three gaps in the aluminum islands are made P+ regions thus forming a highly conductive P+ region centered between source and drain regions, a highly conductive region extending from the source region formed in step 4 to the area underlying the gate 1 electrode, and a highly conductive region extending from the drain region formed in step 4 to the area underlying the gate 2 electrode. By the self registration method of this step, the source and drain regions are effectively extended and the channels are given precise definition, each lying directly underneath and in perfect registration with its associated electrode.

A number of experimental P channel dual gate FET transistors were made by the above process. Channel widths were 70 mils, the length of the first channel was 0.15 mil (from source to virtual source and drain), the length of channel 2 was 0.20 mil. Body resistivity was about 10 ohm-cm. and major surfaces parallel the <111> plane. The first channel received a total boron dose of $10.0\times10^{11}$ ions/$cm^2$ while the second channel received a total boron dose of $18.0\times10^{11}$ ions/$cm^2$. FIG. 4 shows the actual results of one of the experimental transistors with a drain voltage of −12 volts and a signal frequency of 1 Khz. This particular transistor features optimum first transconductance, $Y_{fs}$, for the conditions of zero bias on both gates. This transconductance is seen to be several times greater than for the similar transistor of FIG. 3, having equally doped channels.

Figure 12:
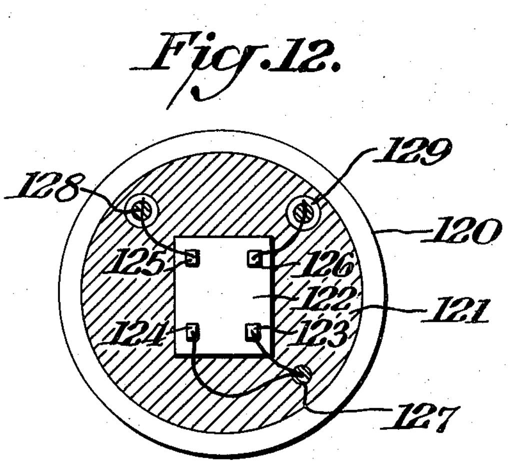
FIG. 12 shows an open view of a transistor of this invention mounted in a conventional package header, with the source connected to the first gate.

The structure of the three leaded package may be the same as for a conventional TO package comprising wire leads molded into a glass header, the wires protruding from one side of the header serving as the external leads and the same wires extending a fraction of an inch from the other side serving as terminal posts. The top view of such a package header is shown in FIG. 12. The under surface of a transistor body 122 is normally bonded to a metal sheet 121 or film that is adhered to the inside of the glass header 120. A 0.001 inch diameter gold wire is thermal-compression bonded to a post 127 and to the source contact 124 on the transistor body. To that same post is bonded another gold wire and to the second gate electrode pad 123 on the body 122, thus forming the internal connection 63 as shown in FIG. 6. The metal sheet 121 is connected to the same post 127 thus connecting the body to the source. A second post 128 is connected to the drain 125 and a third post 129 to the first gate electrode 126 by similar gold wires. Alternatively the three leaded package connections can be realized by electrically connecting the second gate electrode to the source by means of an aluminum run deposited directly on the surface oxide layer covering the semiconductor body. Thus, in FIG. 12 one of the bonded connections to post 127 may be eliminated.

It has been seen that an asymmetrical dual gate FET of this invention may be advantageously packaged with three leads as for example an amplifier (see FIG. 8) or as a mixer (see FIG. 11) where both signals are applied to one gate. However the channel regions of the transistor body depicted in FIG. 8 have been doped such that with a self bias between each gate and source, the transistor has an optimum first transconductance. It would also be practical to dope the second channel such that with zero bias on the second gate to source, and with self bias on the first gate, optimum first transconductance were achieved. In this case, the circuit of FIG. 8 would be modified whereby the connection from the second gate to ground 76 was removed and the second gate connected to the source. A three leaded package of this invention would then be appropriate.

The three leaded package is not suitable for use in the event that signals are applied separately to the first and second gates as for the mixer of FIG. 9.

It will be noted that six embodiments of an asymmetrical dual gate FET have been described wherein the second channel is more conductive than the first, for the condition of equal bias on both gates. Practical use of these structures as amplifiers or mixers have required that both channels be conducting under the conditions of either zero bias or self bias applied to the gates. Two other structures may be made with difficulty that meet these conditions. In an N type body, the first channel may be doped with N type impurities, the same type as the body, similar to the fifth and sixth embodiments previously described. It will be recognized by those skilled in the art that the normally positive surface charge will tend to make the first channel non-conducting for zero bias. The second channel may be undoped or doped less heavily with P type impurities. No practical use is seen for these two structures.

From the foregoing, it will be obvious that it is possible to make an asymmetrical dual gate FET whose second channel is more conductive than the first channel, by asymmetrically treating the channel surfaces and thus unevenly affecting the Qss of the two channels, rather than asymmetrically doping the two channel regions. The latter method, namely the method of this invention is greatly preferred. Channel region doping by diffusion or ion implantation methods is effective in adjusting channel conductivity over a wide range, compared to the method of manipulating Qss.

It will also be apparent that although the embodiments presented herein only treat silicon semiconductor devices, that the principles enunciated are equally valid and of great practical advantage to dual gate FET's employing germanium, gallium-arsenide, and other semiconductor bodies.

In FIGS. 7, 8, 9, and 11, practical circuits are shown wherein the two gates are biased at ground potential. Transformers have been chosen as the preferred devices for applying d.c. gate bias voltages and d.c. drain voltages to the transistors in the simultaneous presence of signal voltages at the same points. In some cases this objective may be better realized by using resistor-capacitor networks or resistor-capacitor-inductor networks. Such alternative circuits may be more suitable for impedance matching between stages or for frequency tuning.

The embodiments presented are considered to be illustrative of the principles of this invention whose scope is to be limited only by the claims appended.

What is claimed is:

1. A dual gate field effect transistor comprising a semiconductor body of one conductivity type; spaced first, second and third low resistivity regions of the opposite conductivity type lying within said body and adjacent to a common surface of said body, said spaced regions constituting the source, the virtual source-drain and the drain regions respectively, a first conductive channel region being defined by the space between said source and said virtual source-drain; a second channel region being defined by the space between said virtual source-drain and said drain, said second channel region containing a greater concentration of dopant impurities of said opposite type than said first channel region, or said first channel region containing a greater concentration of dopant impurities of said one type than said second channel, or both; an insulating layer covering at least the portions of said surface adjacent to said first and second channels; a first gate electrode on said insulating layer extending over said first channel; a second gate electrode on said insulating layer extending over said second channel; a metal conductor making ohmic connection between an undoped region in said body and said low resistivity source region and being further connected to said second gate electrode; and a protective outer package having first, second and third electrical terminals accessible external to said package, said terminals being connected internal to said package with said source, said first gate electrode and said drain, respectively, such that with a zero bias voltage applied between said first gate and said source, said second channel is more conductive than said first channel.

* * * * *